(12) United States Patent
Abatchev et al.

(10) Patent No.: US 7,662,718 B2
(45) Date of Patent: Feb. 16, 2010

(54) TRIM PROCESS FOR CRITICAL DIMENSION CONTROL FOR INTEGRATED CIRCUITS

(75) Inventors: Mirzafer K. Abatchev, Boise, ID (US); Krupakar Murali Subramanian, Boise, ID (US); Baosuo Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 311 days.

(21) Appl. No.: 11/372,825

(22) Filed: Mar. 9, 2006

(65) Prior Publication Data

US 2007/0212889 A1  Sep. 13, 2007

(51) Int. Cl.
*H01L 21/302* (2006.01)

(52) U.S. Cl. .................. 438/689; 438/725; 438/736; 257/E21.02

(58) Field of Classification Search .......... 438/689–744
See application file for complete search history.

(56) References Cited

U.S. PATENT DOCUMENTS

| | | | |
|---|---|---|---|
| 5,139,904 A | 8/1992 | Auda | |
| 5,324,676 A | 6/1994 | Guterman | |
| 5,431,770 A | 7/1995 | Lee | |
| 5,804,088 A | 9/1998 | McKee | |
| 5,885,887 A | 3/1999 | Hause et al. | |
| 5,930,634 A | 7/1999 | Hause et al. | |
| 5,965,461 A | 10/1999 | Yang et al. | |
| 6,020,111 A | 2/2000 | Mihara | |
| 6,121,123 A | 9/2000 | Lyons et al. | |
| 6,156,485 A | 12/2000 | Tang et al. | |
| 6,156,629 A * | 12/2000 | Tao et al. | 438/535 |
| 6,174,818 B1 | 1/2001 | Tao et al. | |
| 6,194,323 B1 | 2/2001 | Downey et al. | |
| 6,248,635 B1 | 6/2001 | Foote et al. | |
| 6,277,750 B1 | 8/2001 | Pawlowski et al. | |
| 6,281,130 B1 | 8/2001 | Pike | |
| 6,420,097 B1 | 7/2002 | Pike et al. | |
| 6,429,067 B1 | 8/2002 | Liu et al. | |

(Continued)

OTHER PUBLICATIONS

Wesley C. Natzle et al., "Trimming of Hard-masks by Gaseous Chemical Oxide Removal (COR) for Sub-10nm Gates/fins, for fate length control and for embedded logic," IEEE, Advanced Semiconductor Manufacturing Conference, 2004, pp. 61-64.*

(Continued)

*Primary Examiner*—Ha Tran T Nguyen
*Assistant Examiner*—Daniel Whalen
(74) *Attorney, Agent, or Firm*—Knobbe, Martens, Olson & Bear LLP

(57) ABSTRACT

Methods of etching substrates employing a trim process for critical dimension control for integrated circuits are disclosed. In one embodiment, the method of etching includes providing a first hard mask layer over a target layer; providing a second hard mask layer over the first hard mask layer; providing a photoresist layer over the second hard mask layer; forming a pattern in the photoresist layer; transferring the pattern into the second hard mask layer; and trimming the second hard mask layer with the photoresist layer on top of the second hard mask layer. The top surface of the second hard mask layer is protected by the photoresist and the substrate is protected by the overlying first hard mask layer during the trim etch, which can therefore be aggressive.

23 Claims, 11 Drawing Sheets

U.S. PATENT DOCUMENTS

| | | | |
|---|---|---|---|
| 6,764,903 B1 * | 7/2004 | Chan et al. | 438/257 |
| 6,828,205 B2 * | 12/2004 | Tsai et al. | 438/313 |
| 6,890,448 B2 | 5/2005 | Pavelchek | |
| 6,900,002 B1 | 5/2005 | Plat et al. | |
| 6,913,958 B1 | 7/2005 | Plat et al. | |
| 2003/0224606 A1 | 12/2003 | Laaksonen et al. | |
| 2004/0087092 A1 | 5/2004 | Huang et al. | |
| 2005/0098091 A1 | 5/2005 | Babich et al. | |
| 2005/0124162 A1 | 6/2005 | Volkel | |
| 2005/0164478 A1 * | 7/2005 | Chan et al. | 438/585 |
| 2006/0024945 A1 * | 2/2006 | Kim et al. | 438/618 |
| 2006/0046483 A1 | 3/2006 | Abatchev et al. | |
| 2007/0037101 A1 * | 2/2007 | Morioka | 430/313 |

OTHER PUBLICATIONS

International Search Report dated Jul. 20, 2007 for counterpart International Application No. PCT/US2007/005639.

* cited by examiner

TRIM PROCESS FOR CRITICAL DIMENSION CONTROL FOR INTEGRATED CIRCUITS

BACKGROUND OF THE INVENTION

1. Field of the Invention

The present invention relates to the field of integrated circuit fabrication, particularly to a trim process for critical dimension control for integrated circuits.

2. Description of the Related Art

In the semiconductor industries, integrated circuit (IC) devices have become faster, smaller, and more efficient. This trend has continued with the development of fabrication technology to increase circuit densities on chips.

Reducing critical dimension is one of the important ways to increase circuit densities. The critical dimension (CD) is the dimension of the smallest geometrical features (width of interconnect line, contacts, trenches, etc.) which can be formed during semiconductor device manufacturing. Critical dimensions need to be reduced in order to facilitate the formation of smaller components and faster, more efficient circuits.

One way of reducing the CD is using a photolithography employing light of a short wavelength. However, as the wavelength of light decreases, photoresist materials become increasingly opaque to the light. Therefore, the current photolithographic technology has a limit in reducing the CD.

Another way of reducing the CD is trimming or shrinking a photoresist pattern by an etch process after forming the pattern by a photolithographic process. A trim process is typically employed for reducing feature edge roughness, reducing size of features, and/or increasing spaces between features. However, etching into underlying layers or structures with small CDs can be troublesome when only using such a photoresist. When etching deep into a substrate to define small features, the photoresist pattern is altered by the etch process by the time the etch process is complete. This causes the substrate to be etched outside of the desired pattern. Poor etching can cause defects in the performance of the device and poor yields. To avoid this problem, a hard mask has been used to transfer a pattern from a photoresist into a substrate.

Yet another way of reducing the CD is shrinking or trimming a hard mask by an etch process after transferring a pattern from photoresist but before transferring the pattern into a substrate. However, this method is not without any problems. While shrinking the pattern width of a hard mask, the thickness of the hard mask can also be reduced. U.S. Pat. No. 6,420,097 illustrates a process by which a hard mask is selectively recessed beneath photoresist. However, while shrinking the hard mask, the substrate or layer of interest underlying the hard mask is also exposed to the hard mask etchant through the openings of the hard mask. These problems prevent the use of an aggressive etch process to reduce the CD. Furthermore, the process is limited to use of particular materials that will permit recessing, and even this can result in deviations from the desired dimensions.

SUMMARY OF THE INVENTION

In one aspect of the invention, a method of etching for an integrated circuit is disclosed. The method comprises providing a first hard mask layer over a target layer; providing a second hard mask layer over the first hard mask layer; providing a photoresist layer over the second hard mask layer; forming a pattern in the photoresist layer; transferring the pattern into the second hard mask layer; and trimming the second hard mask layer with the photoresist layer on top of the second hard mask layer.

In the above method, the target layer may comprise a material selected from the group consisting of insulator, semiconductor, and metal. The first hard mask layer may comprise an amorphous carbon layer. The first hard mask layer may comprise an organic underlayer. The first hard mask layer may have a thickness ranging from about 200 Å to about 20,000 Å. The first hard mask layer may have an aspect ratio of less than about 20:1.

In the method described above, the second hard mask layer may comprise an inorganic layer. The inorganic layer may comprise a dielectric anti-reflective coating (DARC). The inorganic layer may comprise a material selected from the group consisting of silicon oxynitride, silicon oxide, or silicon nitride. The second hard mask layer may comprise a silicon-containing organic layer. The second hard mask layer may have a thickness ranging from about 50 Å to about 1,000 Å. In the method, the photoresist may comprise a photoresist selected from the group consisting of a 13.5 nm photoresist, a 157 nm photoresist, a 193 nm photoresist, and a 248 nm photoresist.

In the above-described method, transferring the pattern into the second hard mask layer may comprise using an anisotropic etch process. Using the anisotropic etch process may comprise using a fluorocarbon-based plasma. In the method, trimming the second hard mask layer may comprise reducing a feature width of the second hard mask layer by at least about 10 Å. Trimming the second hard mask layer may comprise selectively etching the second hard mask layer relative to the photoresist layer and the first hard mask layer. Trimming the second hard mask layer may comprise etching the second hard mask layer at a rate of between about 1 and 1,000 times faster than the etch rate of the first hard mask layer. Trimming the second hard mask layer may comprise etching the second hard mask layer at a rate of between about 1 Å and 10 Å per second.

In the method, trimming the second hard mask layer may comprise isotropically etching the second hard mask layer. Trimming the second hard mask layer may comprise etching the second hard mask layer with a plasma. The plasma may comprise a fluorine-containing plasma. The plasma may comprise a plasma selected from the group consisting of a $NF_3$-based plasma and a $SF_6$-based plasma. Alternatively, trimming the second hard mask layer may comprise using a wet etching process. Using the wet etching process may comprise using a buffered oxide etch process. The buffered oxide etch process may comprise using an etchant comprising HF, $NH_4F$, and $H_2O$.

The method described above may further comprise transferring a pattern resulting from trimming the second hard mask layer into the first hard mask layer. Transferring the pattern resulting from trimming the second hard mask layer into the first hard mask layer may comprise using a high density plasma etch process. Transferring the pattern resulting from trimming the second hard mask layer into the first hard mask layer may comprise etching the first hard mask layer at a rate of above about 5 times faster than the etch rate of the second hard mask layer. Transferring the pattern resulting from trimming the second hard mask layer into the first hard mask layer may comprise etching the first hard mask layer using a sulfur and oxygen-based plasma. Transferring the pattern resulting from trimming the second hard mask layer into the first hard mask layer may comprise flowing between 10 sccm and 75 sccm of sulfur dioxide into a processing chamber. Transferring the pattern resulting from trimming the second hard mask layer into the first hard mask layer may comprise flowing between 20 sccm and 60 sccm of sulfur dioxide into a processing chamber. Transferring the pattern resulting from trimming the second hard mask layer into the first hard mask layer may further comprise flowing between 10 sccm and 100 sccm of oxygen into the processing chamber. Transferring the pattern resulting from trimming the second hard mask layer into the first hard mask layer may further comprise flowing argon into the processing chamber.

The method described above may further comprise providing a bottom antireflective coating (BARC) layer over the second hard mask layer. The bottom antireflective coating layer may have a thickness ranging from about 200 Å to about 500 Å.

In another aspect of the invention, a method for manufacturing an integrated circuit device is disclosed. The method comprises providing a first hard mask over a substrate; providing a second hard mask over the first hard mask; providing a resist having a pattern over the second hard mask; anisotropically etching the second hard mask using the pattern of the resist; and isotropically etching the second hard mask with the resist on top of the second hard mask.

In the method, the integrated circuit device may comprise a memory. The integrated circuit device may comprise a microprocessor. The resist layer may comprise a material selected from the group consisting of a photoresist and an imprint lithography resist.

In another aspect of the invention, a trim process for critical dimension control for integrated circuit device is disclosed. The trim process comprises protecting a substrate during a trim process by providing a first hard mask over the substrate with the first hard mask underlying a second hard mask having a pattern; and protecting a top surface of the second hard mask during the trim process by providing a resist on top of the second hard mask.

In yet another aspect of the invention, a masking structure for an integrated circuit is disclosed. The masking structure comprises a first hard mask layer formed over a target layer; and a second hard mask layer formed over the first hard mask layer, the second hard mask layer comprising a pattern with masking portions configured to cover the first hard mask layer; and a resist layer formed over the second hard mask layer, the resist layer comprising a pattern with masking portions corresponding to the masking portions of the second hard mask layer. In the masking structure, each of exposed side surfaces of the masking portions of the second hard mask layer may have an average roughness of less than about 50 Å rms. Each of exposed side surfaces of the masking portions of the second hard mask layer may have an average roughness of between about 10 Å rms and about 50 Å rms.

In the masking structure described above, widths of the masking portions of the second hard mask layer may be substantially the same as widths of the corresponding masking portions of the resist layer. Alternatively, widths of the masking portions of the second hard mask layer may be narrower than widths of the corresponding masking portions of the resist layer. Each of the exposed side surfaces of the masking portions of the second hard mask layer may be recessed beneath the resist layer by at least 5 Å.

In yet another aspect of the invention, a method of manufacturing an integrated circuit is disclosed. The method comprises using the masking structure described above for a process selected from the group consisting of doping, oxidation, nitridation, and selective deposition.

DETAILED DESCRIPTION OF THE PREFERRED EMBODIMENTS

Definitions

In the context of this document, the term "semiconductor substrate" is defined to mean any construction comprising semiconductor materials, including, but not limited to, bulk semiconductor materials such as a semiconductor wafer (either alone or in integrated assemblies comprising other materials thereon), and semiconductor material layers (either alone or in integrated assemblies comprising other materials). The term "substrate" refers to any supporting substrate, including, but not limited to, the semiconductor substrates described above. Also in the context of this document, the term "layer" encompasses both the singular and the plural unless otherwise indicated. As used herein, the term "organic" refers to carbon and carbon-containing materials, thus including amorphous carbon as well as photoresists. Also note that "sulfur oxide," as used herein, means any compound consisting essentially of a combination of sulfur and oxygen, such as sulfur dioxide.

The term "target layer," as used herein, refers to a layer in which semiconductor devices, components, or parts are formed or processed according to a pattern formed in an overlying hard mask. The target layer may be part of the semiconductor substrate described above. The target layer may be formed of metal, semiconductor, and/or insulator. In the target layer, portions of integrated circuit devices such as memories or microprocessors may be formed. While "processing" through hard masks is described for the preferred embodiments as etching to transfer the hard mask pattern into a target layer, the skilled artisan will appreciate that processing in other embodiments can comprise, e.g., oxidation, nitridation, selective deposition, doping, etc. through the hard mask.

The term "trimming," as used herein, refers to cleaning roughness of a layer or reducing a feature width of a layer in a lateral direction. The term may be interchangeably used with "shrinking."

It will also be appreciated that transferring a pattern from a first level to a second level involves forming features in the second level that generally correspond to features on the first level. For example, the path of lines in the second level will generally follow the path of lines on the first level and the location of other features on the second level will correspond to the location of similar features on the first level. The precise shapes and sizes of features can vary from the first level to the second level, however due, for example, to the trim and growth steps. For example, depending upon etch chemistries and conditions, the sizes of and relative spacings between the features forming the transferred pattern can be enlarged or diminished relative to the pattern on the first level, while still resembling the same initial "pattern."

Overall Etching Process

Figure 1A:
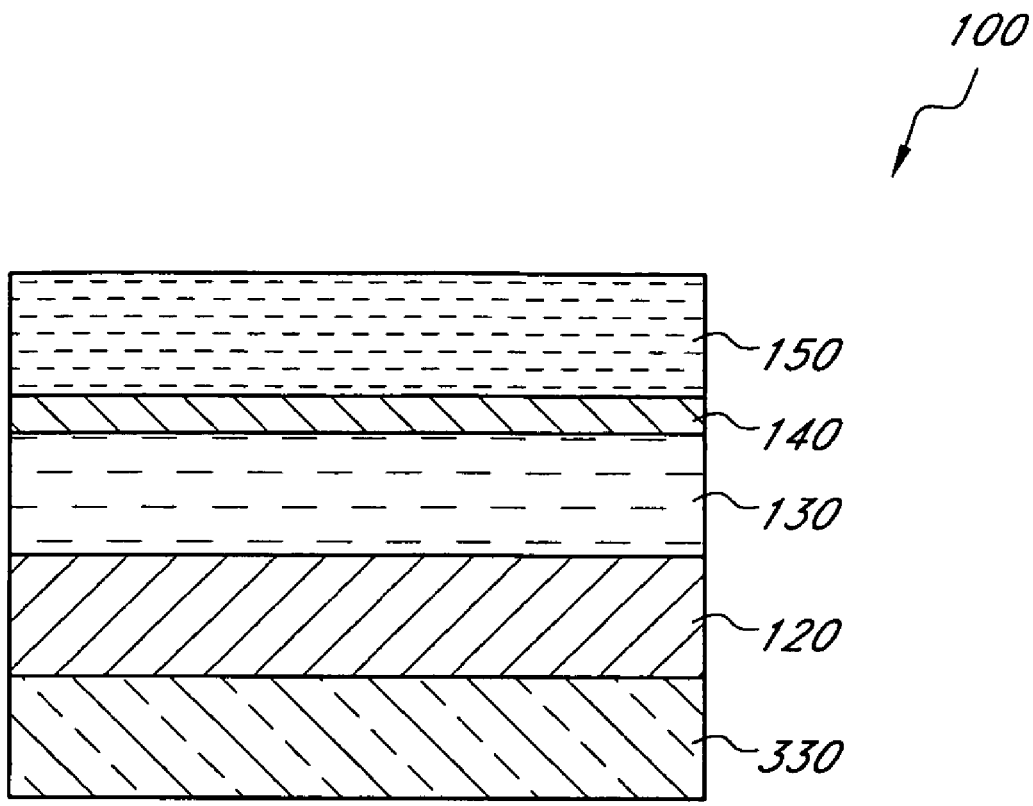
FIGS. 1A-1F are schematic cross-sections illustrating a process of etching for an integrated circuit in accordance with an embodiment of the invention.

FIGS. 1A-1F illustrate a method of etching for an integrated circuit according to an embodiment of the invention. Referring to FIG. 1A, a target layer 120 is provided over a substrate 110. Then, a first hard mask layer 130 is provided over the target layer 120. A second hard mask layer 140 is provided over the first hard mask layer 130. The second hard mask layer 140 is preferably thinner than the first hard mask layer 130. In addition, the second hard mask layer 140 is formed of a material different from that of the first hard mask layer 130. Finally, a photoresist layer 150 is provided over the second hard mask layer 140.

Figure 1B:
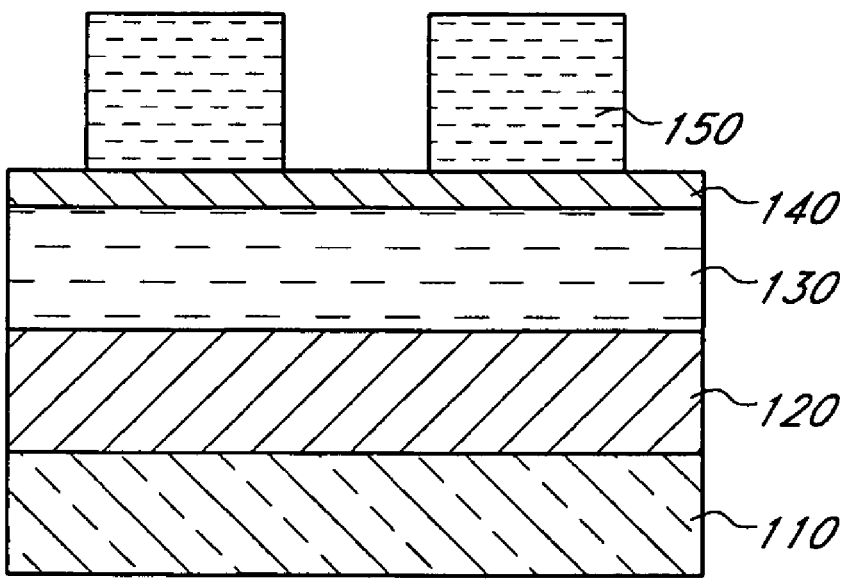
Figure 1C:
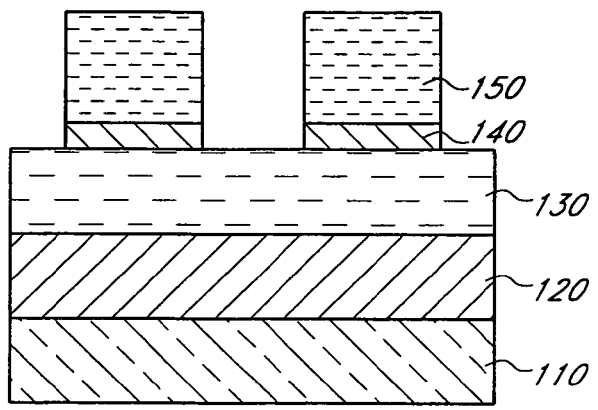
Figure 1D:
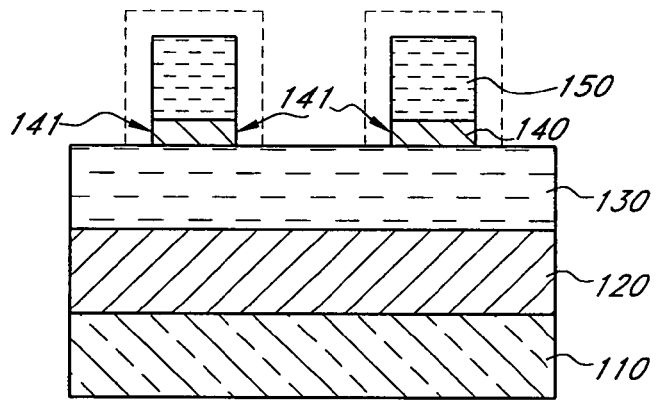

Referring to FIG. 1B, a pattern is formed in the photoresist layer 150, using lithography, such as a conventional photolithographic technology. Then, the pattern is transferred into the second hard mask layer 140 by an etch process as shown in FIG. 1C. The second hard mask layer 140 is then trimmed or shrunk by an isotropic etch process while the photoresist layer 150 is on top of the second hard mask layer 140 as shown in FIG. 1D.

Figure 1E:
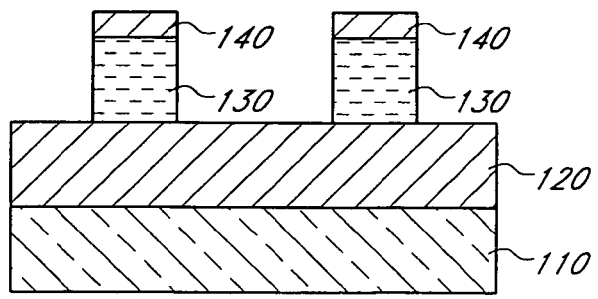
Figure 1F:
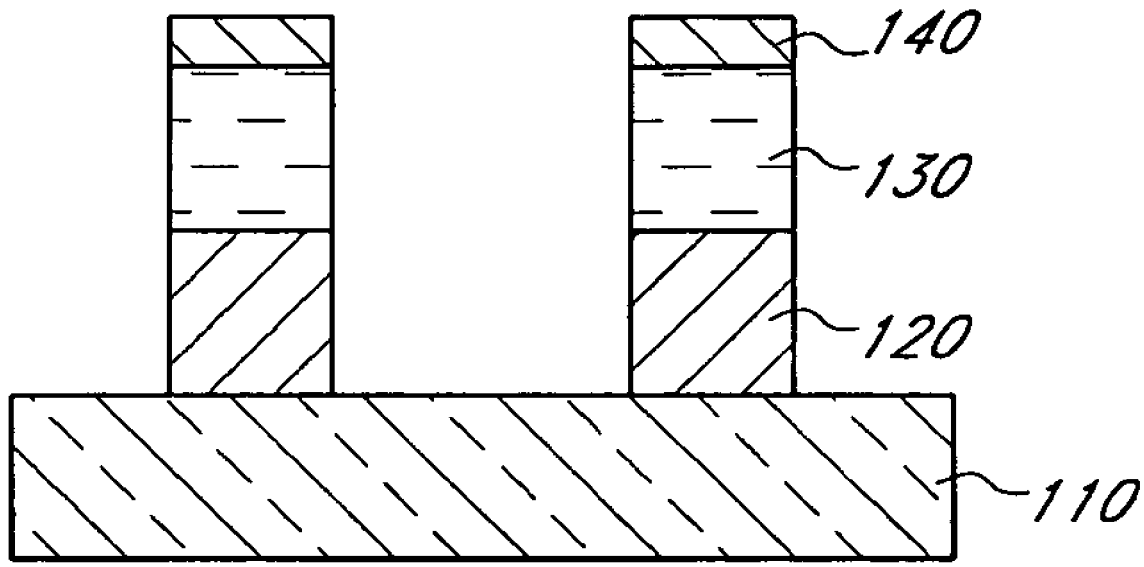

Next, the pattern in the second hard mask layer 140 is transferred into the first hard mask layer 130 as shown in FIG. 1E. In one embodiment, an $SO_2$-based plasma dry develop etch (DDE) can be used to transfer the pattern into the first hard mask layer 130. Using the dry develop etch process, the first hard mask layer 130 is etched to form a hard mask to etch the target layer 120. The target layer 120 is then processed, in the illustrated embodiment, using the first hard mask layer 130 as shown in FIG. 1F. The second hard mask layer etched 140 can be left in place, as shown, or removed prior to processing the target layer 120 through the hard mask. Each of the steps above will now be described below in detail.

Hard Mask Layer Creation

FIG. 1A illustrates a portion 100 of an integrated circuit (IC) to be fabricated according to one embodiment. A substrate 110 is provided at the bottom of the portion 100. In the illustrated embodiment, the substrate 110 is a silicon substrate. In other embodiments, the substrate 110 may be formed of other types of semiconductor materials.

A target layer 120 is formed over the substrate 100. The target layer 120 is a layer in which various IC components, parts, and structures are to be formed through IC fabrication processes. Examples of the components, parts, and structures include transistors, capacitors, resistors, diodes, conductive lines, electrodes, spacers, trenches, etc. The kind of target layer material depends on the type of device to be formed in the target layer 120. Examples of the target layer materials include, but are not limited to, insulator, semiconductor, and metal.

A first hard mask layer 130 is formed over the target layer 120. The first hard mask layer 130 overlies the structure to be processed (e.g., etched). The first hard mask layer 130 provides a pattern to be transferred into the target layer 120. The first hard mask layer 130 may be formed of an organic material. In the illustrated embodiment, the first hard mask layer 130 is formed of amorphous carbon. A preferred type of amorphous carbon is a colorless, transparent carbon that facilitates photo alignment to underlying layers. Because the first hard mask layer 130 is preferably thick, an opaque film could hinder photo alignment.

In other embodiments, the first hard mask layer 130 may be formed of a polymeric material which can be also used as a photoresist underlayer. Preferably, the polymeric material is an organic material which has more carbon content than a conventional photoresist. Examples of the polymeric material are disclosed in U.S. Pat. No. 6,890,448, which is incorporated herein by reference. In addition, the polymeric material may be AR series anti-reflectants commercially available from Shipley Company, Marlborough, Mass.

Preferably, the first hard mask layer 130 is quite thick in order to improve processing of the target layer 120. The first hard mask layer 130 preferably has a thickness of between about 200 Å and 20,000 Å, more preferably between about 500 Å and 10,000 Å. A thick first hard mask layer 130 stands up better to processing through the hard mask. However, the thickness of the first hard mask layer depends on the aspect ratio. The aspect ratio of the first hard mask layer 130 is preferably less than about 20:1 for mechanical stability.

A second hard mask layer 140 is formed over the first hard mask layer 130. The second hard mask layer 140 provides a pattern to be transferred into the first hard mask layer 130. The second hard mask layer 140 preferably provides a pattern with a narrower linewidth than that of the photoresist layer 150.

The second hard mask layer 140 may be formed of an inorganic material or a silicon-containing organic layer. In the illustrated embodiment, the second hard mask layer 140 is formed of a dielectric anti-reflective coating (DARC), for example, silicon-rich silicon oxynitride ($SiO_xN_y$). The DARC layer may contain silicon in an amount from about 30 wt % to about 80 wt % with reference to the total weight of the layer. Preferably, the DARC layer may contain silicon in an amount from 35 wt % to about 70 wt % with reference to the total weight of the layer. In another embodiment, the second hard mask layer 140 may be formed of silicon, silicon oxide ($SiO_2$) or silicon nitride ($Si_3N_4$).

In another embodiment, the second hard mask layer 140 may be formed of a silicon-containing organic material. The silicon-containing organic material is different from a material of which the first hard mask layer 130 can be formed. The silicon-containing organic layer may contain silicon in an amount from about 10 wt % to about 35 with reference to the total weight of the layer. An exemplary silicon-containing organic material is SHB-A629 (Shin Etsu). The second hard mask layer 140 preferably has a thickness of between about 50 Å and 1,000 Å, more preferably between about 1,000 Å and 700 Å.

Photoresist Layer Creation and Patterning

Referring back to FIG. 1A, a photoresist layer 150 is formed over the second hard mask layer 140. In the illustrated embodiment, the photoresist layer 150 may be formed of a photoresist sensitive to common wavelengths of light employed in lithography, including 248 nm, 193 nm, 157 nm, and 13.5 nm. Preferably, the photoresist layer 150 has a thickness of between about 500 Å and 3,000 Å, more preferably between about 1,000 Å and 2,000 Å. In FIG. 1B, the photoresist layer 150 has been patterned using any suitable photoresist processing technique.

In other embodiments, the resist layer 150 may be formed of a resist used for other types of lithography for pattern imaging on the wafer. Examples of such lithography include, but are not limited to ultraviolet (UV) lithography, extreme ultraviolet (EUV) lithography, X-ray lithography and imprint contact lithography.

Figure 3A:
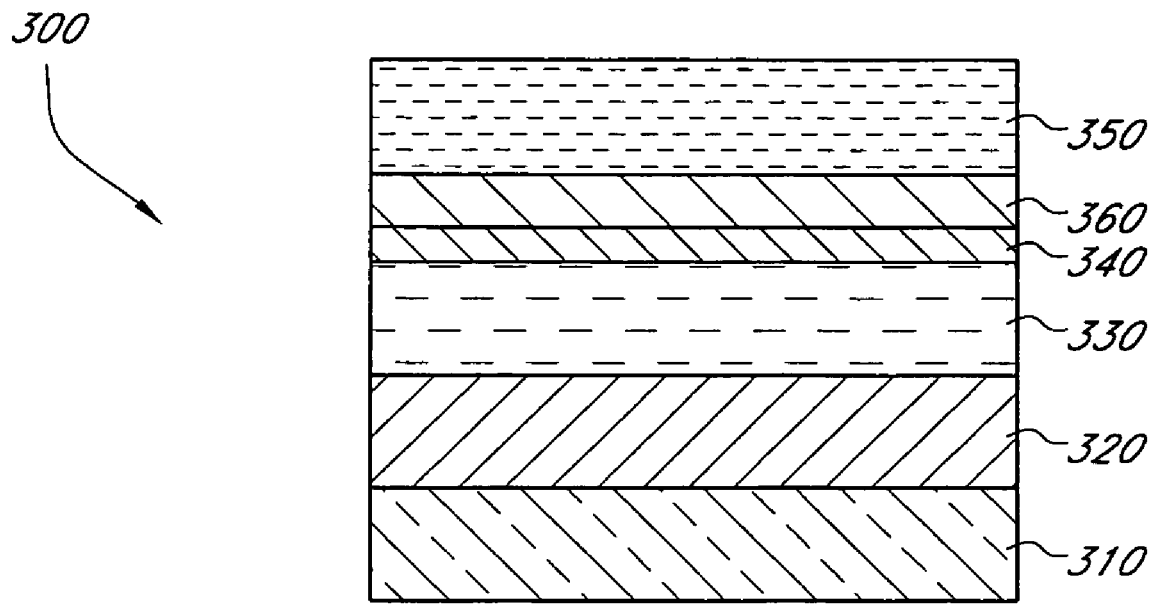
FIGS. 3A and 3B illustrate a partial process of forming a hard mask using a BARC layer in accordance with an embodiment of the invention.

Referring to FIG. 3A, a bottom anti-reflective coating (BARC) layer 360 may optionally be formed between the second hard mask layer 340 and the photoresist layer 350. BARCs, which are typically organic, enhance the resolution by preventing reflections of the ultraviolet (UV) radiation that activates the photoresist. BARCs are widely available, and are usually selected based upon the selection of the resist material and the UV wavelength. BARCs, which are typically polymer based, are usually removed along with the accompanying photoresist. The optional BARC layer 360 preferably has a thickness of between about 200 Å and 500 Å, more preferably between about 300 Å and 400 Å.

Pattern Transfer into the Second Hard mask

The pattern formed in the photoresist 150 is preferably transferred into the second hard mask 140 using a plasma etch process, most preferably a high density plasma etch process. Preferably, the plasma etch process is an anisotropic etch process.

In FIG. 1C, the pattern from the photoresist layer 150 has been transferred into the second hard mask layer 140. The transfer is preferably accomplished using a fluorocarbon plasma dry etch in a processing chamber. A dry etch, preferably employing a high density plasma, can be used to provide patterning of the second hard mask layer 140 in a manner faithful to the dimensions of the resist elements. The power levels and flow rates will vary based upon a selected processing chamber. Preferred chambers include Lam Research Corp.'s (Fremont, Calif.) TCP9400 and TCP2300 poly etch chambers and Applied Materials Corp.'s (Santa Clara, Calif.) DPS2 poly etch chamber. Skilled artisans will appreciate that there are several possible etch processes that can be used to transfer the pattern from the photoresist layer 150 into the second hard mask layer 140.

Preferably, the chamber employed to etch the second hard mask 140 is used to trim or shrink the second hard mask layer 140 in the next step. After the second hard mask layer 140 has been etched, the chamber is purged during a transition step. The ionizing power is left on the chamber, but the bias power is turned off. The plasma used for etching the second hard mask layer 140 is purged from the chamber.

Second Hard Mask Trim

Figure 4:
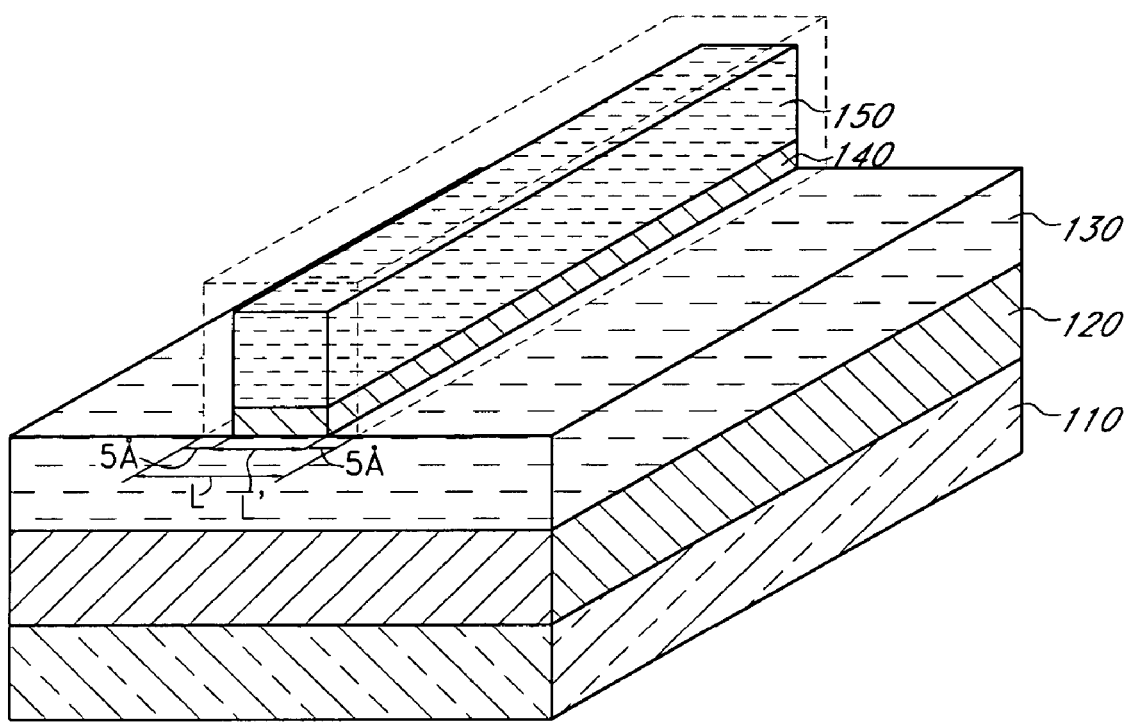
FIG. 4 is a partial perspective view of the partially formed integrated circuit of FIG. 1D.

Referring to FIGS. 1D and 4, the second hard mask layer 140 is shrunk or trimmed while the photoresist layer 150 is on top of the second hard mask layer 140. The trim step causes etching in a lateral direction that reduces the critical dimension. The trim step also reduces feature edge roughness. Preferably, the edges of the second hard mask layer have an average roughness ($R_a$) of between about 10 Å rms and about 100 Å rms. Preferably, this trim step is conducted using an isotropic etch process.

In FIG. 4, the photoresist layer 150 and the second hard mask layer 140 before the trim step are shown in dotted lines. The second hard mask layer 140 had an initial linewidth L. After the trim step, the second hard mask layer 140 has a reduced linewidth L'. The linewidth of the second hard mask 140 is preferably reduced by at least about 10 Å. In other words, the difference between the initial linewidth L and the reduced linewidth L' is preferably at least 10 Å. In terms of the extent of etching, each of the exposed side surfaces of the second hard mask layer 140 is etched away by at least about 5 Å in a lateral direction. In one embodiment, the linewidth of a 75 nm line was reduced to 64 nm. In another embodiment, the linewidth of a 77 nm line was reduced to 67 nm.

Dry Etch Trimming

The second hard mask layer 140 including $SiO_xN_y$ or SiN may be shrunk using an isotropic plasma dry etch process. An etchant employed in the trim step is preferably chosen to selectively etch the second hard mask layer 140 while only minimally etching the first hard mask layer 130, thus protecting the substrate. In certain embodiments, the second hard mask layer 140 may be etched as fast as the first hard mask layer 130, but not slower than the first hard mask layer 130. Preferably, the second hard mask layer 140 is etched at a rate of between about 1 and 1,000 times faster than the etch rate of the first hard mask layer 130, more preferably between about 2 and 100 times faster, most preferably between about 10 and 100 times faster.

In one embodiment, the second hard mask layer 140 and the overlying photoresist layer 150 may be etched using an etchant with little or no selectivity between those materials. The second hard mask layer 140 may be etched at a rate substantially the same as or even slower than the etch rate of the overlying photoresist layer 150. Referring to FIG. 1D, the photoresist layer 150 is etched at a rate as fast as that of the second hard mask layer 140. In FIG. 1D, the photoresist layer 150 has been etched as much as the second hard mask layer 140 while line edge roughness of the second hard mask layer 140 is cleaned up or while the second hard mask layer 140 is shrunk to have a desired feature width.

Figure 2A:
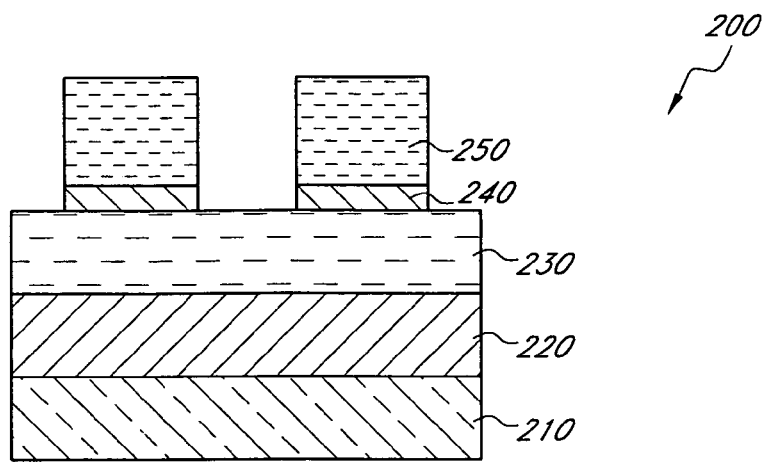
FIGS. 2A-2C illustrate a partial process of forming a hard mask using an etchant with a high selectivity in accordance with an embodiment of the invention.
Figure 2B:
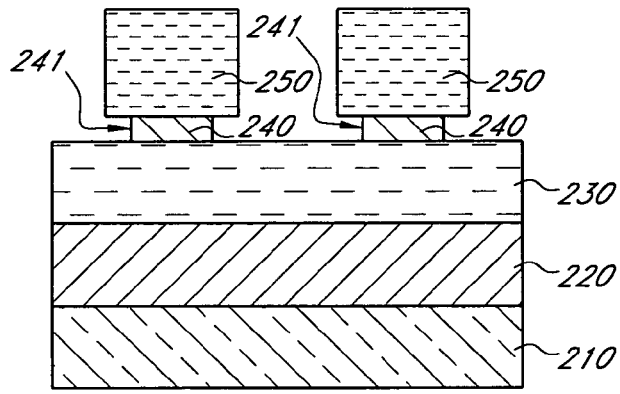
Figure 2C:
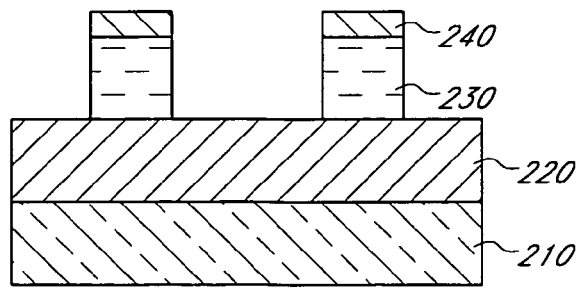

In other embodiments in which the photoresist layer has a thickness of less than 1,000 Å, an etchant having a high selectivity for the second hard mask layer 140 relative to the photoresist 150 is preferably used for the trim step. FIGS. 2A-2C illustrate a partial process of forming a hard mask using an etchant with a high selectivity in accordance with an embodiment of the invention. In FIGS. 2A-2C, similar parts are referenced by reference numbers similar to those of FIGS. 1A-1F but incremented by 100. Referring to FIG. 2A, a target layer 220 is provided over a substrate 210. A first hard mask layer 230 is provided over the target layer 220. A second hard mask layer 240 is provided over the first hard mask layer 230. A photoresist layer 250 is provided over the second hard mask layer 240. Photoresist patterning (not shown) is conducted in a manner similar or identical to that described above with reference to FIG. 1B.

In FIG. 2A, a pattern in the photoresist layer 250 has been transferred into the second hard mask layer 240. The pattern transfer process is similar or identical to that described above with reference to FIG. 1C.

In FIG. 2B, the second hard mask layer 240 has been selectively etched relative to the photoresist layer 250. The second hard mask layer 240 is etched preferably at a rate of between about 2 and 1000 times faster than the etch rate of the photoresist layer 250, more preferably between about 2 and 100 times faster. With a highly selective etchant, the photoresist 250 is only minimally etched while line edge roughness of the second hard mask layer 240 is cleaned or while the second hard mask layer 240 is shrunk to have a desired feature width, resulting in recessing or undercutting as shown.

In FIG. 2C, a pattern in the second hard mask layer 240 has been transferred into the first hard mask layer 230. The pattern transfer from the second hard mask layer 240 into the first hard mask layer 230 is identical or similar to a pattern transfer which will be described later in detail with reference to FIG. 1E.

Figure 3B:
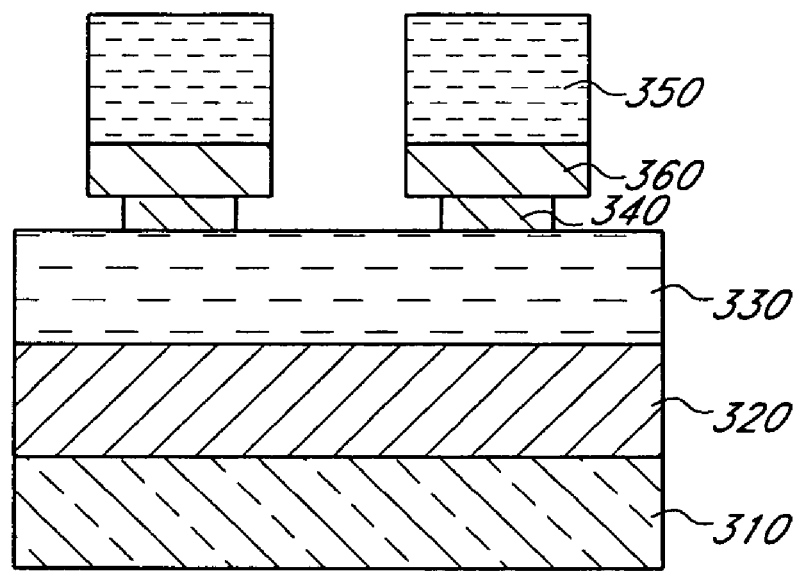

Referring to FIGS. 3A and 3B, in another embodiment, a BARC layer 360 is formed between a photoresist layer 350 and a second hard mask layer 340. In FIGS. 3A and 3B, similar parts are referenced by reference numbers similar to those of FIGS. 1A-1F but incremented by 200. In this embodiment, the BARC layer 360 is etched at a rate almost the same as that of the photoresist layer 350. With an etchant highly selective for etching the second hard mask layer 340, the photoresist layer 350 and the BARC layer 360 are only minimally etched while line edge roughness of the second hard mask layer 340 is reduced or while the second hard mask layer 340 is shrunk to have a desired feature width as shown in FIG. 3B. On the other hand, with an etchant with a low selectivity for the second hard mask 340, the photoresist and the BARC layer would be shrunk at a rate almost as fast or even faster than that of the second hard mask layer 340 similar to the embodiment of FIGS. 1A-1F.

The etch rate is preferably between about 2 and 20 Å/sec for both sides of a line, that is, between about 1 and 10 Å/sec on each side of a line. A preferred etchant for the trim step on the preferred second hard mask layer 140, 240, 340 is a fluorine-containing plasma. The fluorine-containing plasma may include a $NF_3$ or $SF_6$ based plasma.

One preferred chamber for the trim step is Lam Research Corp.'s TCP9400 poly etch chamber. Using this chamber, preferred precursor gases include $NF_3$ and Ar. In a preferred embodiment with a single wafer, the flow rate for $NF_3$ is preferably between about 10 sccm and 50 sccm, more preferably between about 15 sccm and 30 sccm. The flow rate for Ar is preferably between about 15 sccm and 150 sccm, more preferably between about 20 sccm and 75 sccm. In the chamber, the pressure is preferably between about 4 mTorr and 20 mTorr, more preferably, between about 5 mTorr and 15 mTorr. The ionizing source power, preferably delivered in situ, is preferably between about 100 W and 400 W, more preferably between about 150 W and 300 W. The bias power is preferably between about 0 W. The wafer temperature is preferably between about −10° C. and 20° C., more preferably between about 0° C. and 10° C. Another preferred chamber is Applied Materials Corp.'s DPS2 poly etch chamber.

Figure 5:
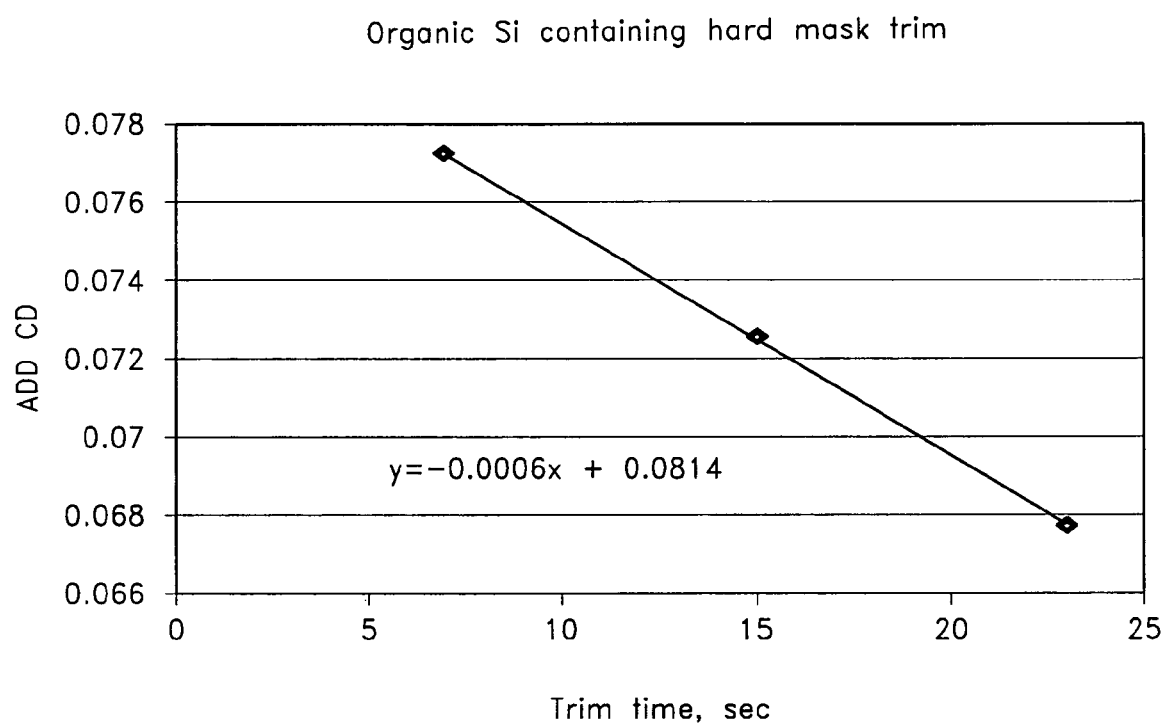
FIG. 5 is a graph illustrating a trim rate for a hard mask layer in accordance with an embodiment of the invention.

In one embodiment, the trim step was conducted on a wafer including a 1600 Å photoresist layer, a 730 Å silicon-containing organic layer as a second hard mask layer, and a 2500 Å organic underlayer as a first hard mask layer. About 20 sccm of $NF_3$ and about 30 sccm of Ar were flowed into the chamber. The chamber was configured to have a pressure of about 10 mTorr and a source (inductive) power of about 200 W. Under these conditions, a trim rate of about 6 Å/sec for a feature width was obtained as shown in FIG. 5. In other words, an etch rate of about 3 Å/sec was obtained for each side of an exposed portion of the second hard mask layer.

Figure 6A:
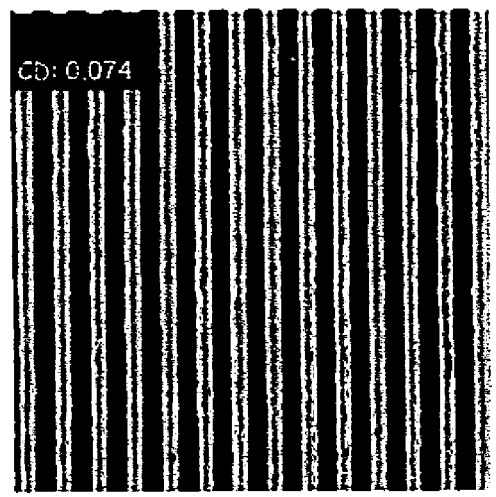
FIGS. 6A-6C are micrographs, taken with a scanning electron microscope, of top views of hard mask patterns trimmed at the trim rate shown in FIG. 5.
Figure 6B:
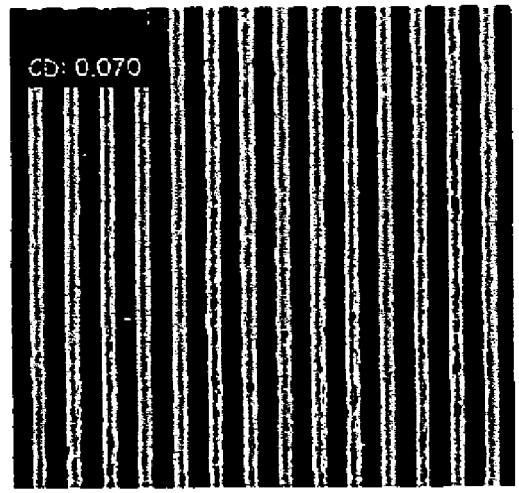
Figure 6C:
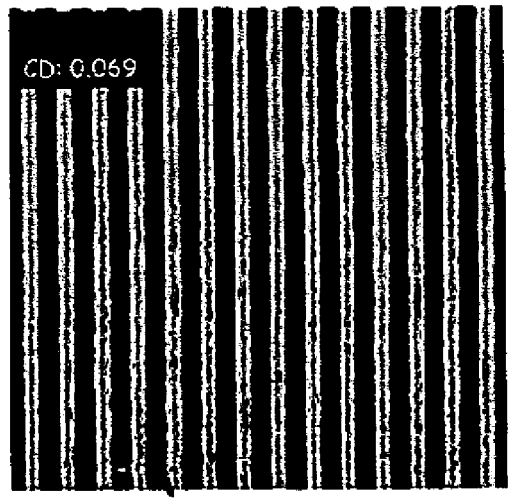
Figure 7:
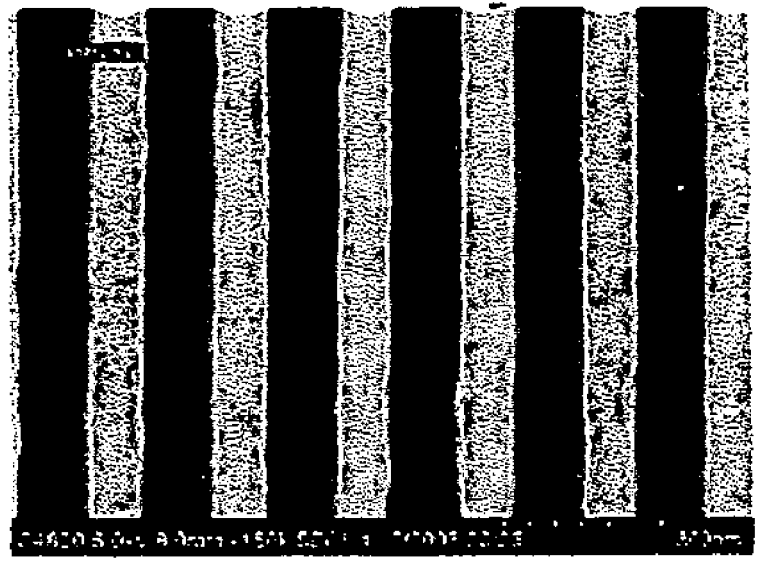
FIG. 7 is an enlarged view of FIG. 6C.

FIGS. 6A-6C are micrographs, taken with a scanning electron microscope, of top views of hard mask patterns trimmed by the trim step described above. The linewidths in microns of the second hard mask patterns are shown on the top left corner of the figures. Before the trim step, the second hard mask layer had an initial linewidth of about 81 nm. After the trim step, the linewidth was reduced to about 74 nm, 70 nm, and 69 nm as shown in FIGS. 6A, 6B, and 6C, respectively. It took about 12 seconds, 19 seconds, and 21 seconds for the linewidth to be reduced to about 74 nm, 70 nm, and 69 nm, respectively. FIG. 7 is an enlarged view of FIG. 6C. The second hard mask layer shown in FIG. 7 has a trimmed pattern having a linewidth of about 69 nm.

Figure 8:
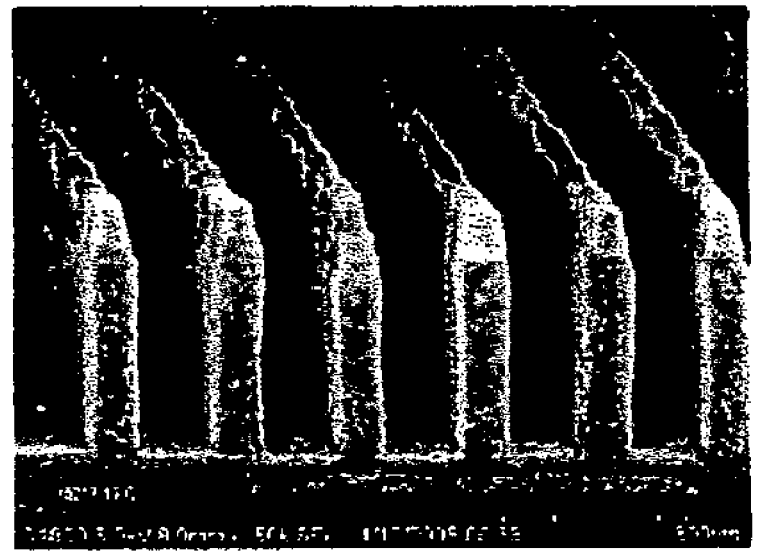
FIG. 8 is a micrograph, taken with a scanning electron microscope, of a side cross section of the trimmed hard mask pattern of FIG. 7.

In addition, FIG. 8 is a micrograph, taken with a scanning electron microscope, of a side cross section of the trimmed hard mask pattern. FIG. 8 shows a cross-section of line/space patterns after a pattern transfer from the second hard mask layer into the first hard mask which will be described later in detail. The second hard mask layer which has been trimmed as described above remains on top of the first hard mask layer. FIG. 8 shows excellent fidelity and reasonable line edge roughness. Preferably, the edges of the second hard mask layer have an average roughness ($R_a$) of between about 10 Å rms and about 100 Å rms, more preferably an average roughness ($R_a$) of less than about 50 Å rms, most preferably an average roughness ($R_a$) of between about 10 Å rms and about 50 Å rms.

Figure 9:
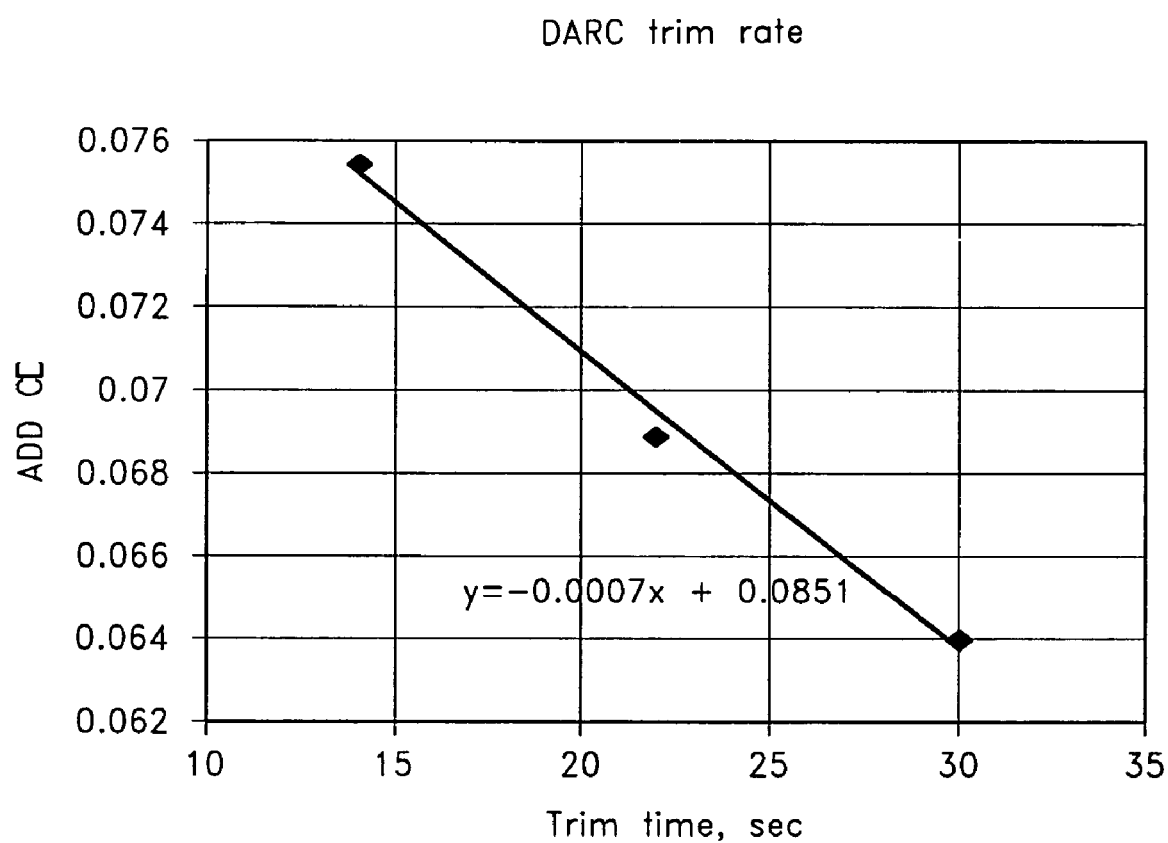
FIG. 9 is a graph illustrating a trim rate for another hard mask layer in accordance with an embodiment of the invention.

In another embodiment, the trim step was conducted on a wafer including a 1600 Å photoresist layer, a 400 Å BARC layer, a 260 Å DARC layer as a second hard mask layer, and a 2000 Å amorphous carbon layer as a first hard mask layer. In this embodiment, a BARC layer was used as in the embodiment described above with reference to FIGS. 3A and 3B. About 20 sccm of $NF_3$ and about 30 sccm of Ar were flowed into the chamber. The chamber was configured to have a pressure of about 10 mTorr and a bias power of about 200 W. Under these conditions, a trim rate of about 7 Å/sec for a feature width was obtained as shown in FIG. 9. In other words, an etch rate of about 3.5 Å/sec was obtained for each side of an exposed portion of the second hard mask layer.

Figure 10A:
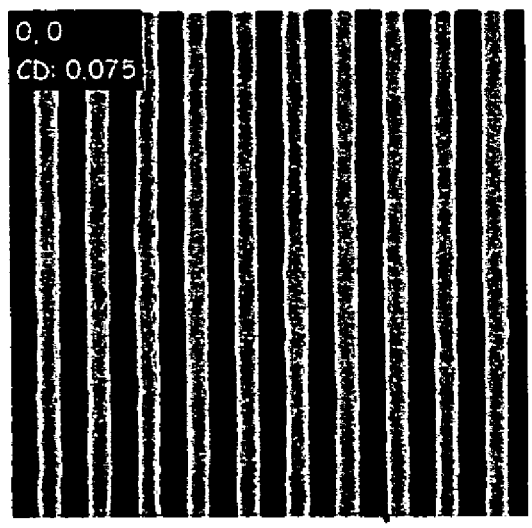
FIGS. 10A-10C are micrographs, taken with a scanning electron microscope, of top views of hard mask patterns trimmed at the trim rate shown in FIG. 9.
Figure 10B:
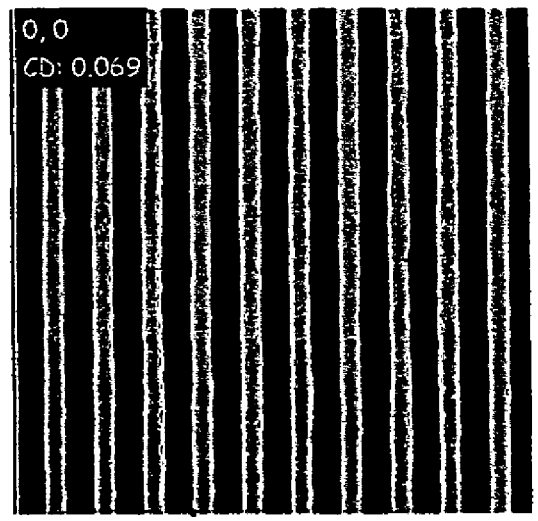
Figure 10C:
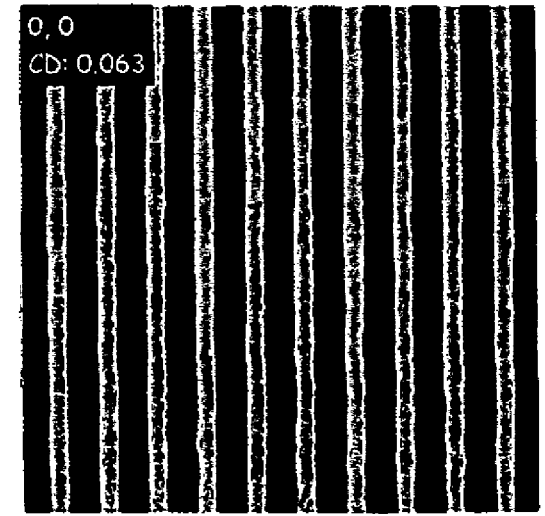

FIGS. 10A-10C are micrographs, taken with a scanning electron microscope, of top views of line/space patterns after a pattern transfer from the second hard mask layer into the first hard mask which will be described later in detail. The second hard mask layer which has been trimmed as described above remains on top of the first hard mask layer. The linewidths in microns of the second hard mask patterns are shown on the top left corner of the figures. Before the trim step, the second hard mask layer had an initial linewidth of about 85 nm. After the trim step, the linewidth of the second hard mask layer was reduced to about 75 nm, 69 nm, and 63 nm as shown in FIGS. 10A, 10B, and 10C, respectively. It took about 14 seconds, 23 seconds, and 32 seconds for the linewidth to be reduced to about 75 nm, 69 nm, and 63 nm, respectively.

Preferably, the chamber that was employed for the trim step is used to etch the first hard mask layer 130. After the second hard mask layer 140 has been etched, the chamber is purged during a transition step. The ionizing source power is left on in the chamber, but the bias power is turned off. The plasma from the trimming of the second hard mask layer 140 is purged from the chamber.

Wet Etch Trimming

The second hard mask layer may be shrunk using an isotropic wet etch process. In one embodiment in which the second hard mask layer 140 is formed of $SiO_2$, a buffered oxide etch may be employed for the isotropic wet etch process. The buffered oxide etch solution contains HF, $NH_4F$, and $H_2O$. In one embodiment, the solution is used with a HF concentration of between about 0.5 wt. % and 20 wt. %, more preferably between about 2 wt. % and 10 wt. %. The substrate temperature is preferably between about 15° C. and 80° C., more preferably between about 20° C. and 25° C.

By way of example, a buffered oxide etch solution containing 6.8% of HF, 34% of $NH_4F$, and 58.6% of $H_2O$ etches $SiO_2$ at a rate of about 100 nm/min. The duration of the etching process may vary based on the desired linewidth of the second hard mask layer 140. Skilled practitioners will appreciate that the concentration of the buffered etch solution, the substrate temperature, and the etch duration can be chosen based on a desired roughness or feature width of the second hard mask layer.

By providing the photoresist layer 150 on top of the second hard mask layer 140 during the trim step, an aggressive etch process can be employed to reduce roughness and to reduce the CD. Such an aggressive etch process does not reduce the thickness of the second hard mask layer 140 because the top portion of the second hard mask layer 140 is protected by the overlying photoresist layer 150. In addition, the first hard mask layer 130 formed over the target layer 120 protects the target layer 120 from the aggressive etch process. Therefore, a more aggressive or longer trim step can be conducted to reduce the CD without undesired damage to the target layer 120. Such a more aggressive or longer trim step is particularly advantageous for forming repeated patterns on arrays of high density, e.g., lines for memory array, conductors, capacitors, etc. or microprocessors, e.g., logic arrays.

Pattern Transfer into the First Hard Mask

Referring to FIG. 1E, a shrunk or trimmed pattern is transferred from the second hard mask layer 140 into the first hard mask layer 130. In FIG. 1E, the pattern in the second hard mask layer 140 has been transferred into the first hard mask layer 130. The first hard mask layer 130 is preferably formed of an organic material, more preferably amorphous carbon. Preferably, the etch process is a dry develop etch (DDE) process. Preferably, the etchant includes sulfur and oxygen and is preferably a plasma. In the illustrated embodiment, a sulfur dioxide ($SO_2$) based plasma is used as an etchant in a process referred to as a DDE carbon etch step. Preferably, the plasma process uses inert gases to help support the plasma.

The etch process for the first hard mask layer 130 is conducted with a high selectivity to the first hard mask layer 130 relative to other layers such as the second hard mask layer 140 and the underlying target layer 120. Preferably, the first hard mask layer 130 is etched at a rate of above about 5 times faster than the etch rate of the second hard mask layer 140, more preferably between about 10 and 50 times faster.

One preferred chamber for such an etch is Lam Research Corp.'s TCP9400 poly etch chamber. In this chamber, the pressure is preferably between 3 mTorr and 20 mTorr, more preferably between about 5 mTorr and 15 mTorr. The ionizing source power, preferably delivered in situ, is preferably between 175 W and 400 W, more preferably between about 225 W and 350 W. The bias power is preferably between about 25 W and 125 W, more preferably between about 30 W and 100 W. The electrode temperature is preferably between about −5° C. and 15° C., more preferably between about 0° C. and 10° C. Using this chamber, preferred etchant gases include $SO_2$, $O_2$, and Ar. In a preferred embodiment with a single wafer, the flow rate for $SO_2$ is preferably between about 10 sccm and 75 sccm, more preferably between about 20 sccm and 60 sccm. The flow rate for $O_2$ is preferably between about 10 sccm and 100 sccm, more preferably between about 20 sccm and 80 sccm. The flow rate for Ar is preferably between about 0 sccm and 175 sccm, more preferably between about 0 sccm and 140 sccm.

In another preferred chamber, Applied Materials Corp.'s IPS oxide etch chamber, the pressure is preferably between 5 mTorr and 20 mTorr, more preferably between about 7 mTorr and 16 mTorr. The in situ ionizing source power is preferably between 350 W and 1200 W, more preferably between about 400 W and 1000 W. The bias power is preferably between about 40 W and 150 W, more preferably between about 50 W and 130 W. The electrode temperature is between about −25° C. and 15° C., more preferably between about −20° C. and 10° C. Using this chamber, preferred etchant gases include $SO_2$, $O_2$, $N_2$ and Ar. In a preferred embodiment with a single wafer, the flow rate for $SO_2$ is preferably between about 10 sccm and 75 sccm, more preferably between about 20 sccm and 60 sccm. The flow rate for $O_2$ is preferably between about 0 sccm and 100 sccm, more preferably between about 0 sccm and 90 sccm. The flow rate for Ar is preferably between about 0 sccm and 175 sccm, more preferably between about 0 sccm and 150 sccm. The flow rate for $N_2$ is preferably between about 0 sccm and 125 sccm, more preferably between about 0 sccm and 100 sccm.

Using a $SO_2$-based plasma, the first hard mask layer 130, which is preferably amorphous carbon, is etched with a high selectivity relative to the second hard mask layer 140. The selectivity of the DDE etching process helps provide an excellent mask for the printing of features on the target layer 120.

In addition, the first hard mask layer 130 is preferably etched with a high selectivity relative to the underlying target layer 120. Preferably, the first hard mask layer 130 is etched at a rate above about 5 times faster than the etch rate of the target layer 120, more preferably above about 10 times faster. With preferred materials, selectivity above 100:1 can be attained. During this etch process, the photoresist layer 150 overlying the second hard mask layer 140 is also etched away.

Target Layer Etching

Referring to FIG. 1F, once the first hard mask 130 is patterned, it can be used to process (e.g. etch) the target layer 120. The target layer 120 may be formed of silicon, silicon oxide, silicon nitride, metal or any other material that needs to be selectively processed (e.g. etched) through a mask during the course of integrated circuit fabrication. In a preferred embodiment, the target layer 120 is processed in the same chamber, but the wafer could also be transported to a different chamber for subsequent processing. The target layer 120 is preferably etched using an etch chemistry appropriate for the selected target layer.

An etch stop layer (not pictured) can be used between the first hard mask layer 130 and the target layer 120. The etch stop can be made of similar materials to those used for the second hard mask layer 130, including DARC and silicon nitride, depending upon the composition of the target layer 120. The etch stop avoids damage to the target layer 120 during the etching of the first hard mask layer 130, such as during pattern transfer to the first hard mask layer 130 or during removal of the first hard mask layer 130. This is particularly important when the target layer 120 is a metal, such as a metallization layer. Metal etched in the DDE chamber can contaminate the chamber and slow down processing. If the target layer 120 includes an exposed metal layer, the wafer is preferably transported to a metal etch chamber for further processing. When processing (e.g. etching) of the target layer is completed, any remaining hard mask material may be removed by known etch processes, such as a wet etch step. In the illustrated embodiment, the second hard mask layer 140 is left on top of the first hard mask layer 130 during the target layer etching step. In other embodiments, the second hard mask layer 140 could be removed prior to processing the target layer 120 through the patterned first hard mask 130. After the target layer etching step described above, additional steps such as metallization are conducted to complete integrated circuits.

Application to Other Types of Lithography

In the illustrated embodiment, the trim step was used in conjunction with photolithography. In other embodiments, the trim step may be used in conjunction with other types of lithography such as imprint lithography. Imprint lithography is a technique that uses a rigid mechanical template for transferring patterns onto a substrate. In the imprint lithography process, a light curable material is placed over the second hard mask layer. Then, a rigid transparent (e.g., quartz) template is brought from the above into contact with the light curable material, imprinting or molding the soft resist. The light curable material is cured by the application of light and the pattern while the template molds the cured material. Then, the pattern is transferred into the second hard mask layer. Subsequently, the second hard mask layer is shrunk while the cured material is on top of the second hard mask layer and the underlying first hard mask layer protects the underlying semiconductor substrate.

Masking Structures

Another aspect of the invention provides a masking structure for an integrated circuit processing. The masking structure may be used for various processes such as doping, oxidation, nitridation, and selective deposition. Referring to FIG. 1D, the masking structure may include a first hard mask layer 130 formed over a target layer 120, a second hard mask layer 140 formed over the first hard mask layer 130, and a resist layer 150 formed over the second hard mask layer 140. It will be understood that in some embodiments the target layer 120 represents the silicon wafer itself where trenches are to be formed. The second hard mask layer 140 includes a pattern with masking portions configured to cover the first hard mask layer 130. The resist layer 150 is configured to have a pattern with masking portions corresponding to the masking portions of the second hard mask layer 140. Each of exposed side surfaces 141 of the masking portions of the second hard mask layer 140 has been isotropically etched.

In one embodiment, each of the exposed side surfaces of the masking portions of the second hard mask layer has been etched by at least 5 Å. Each of the exposed side surfaces of the masking portions of the second hard mask layer may have a root mean square (RMS) roughness of between about 10 Å rms and about 100 Å rms, more preferably less than about 50 Å rms, most preferably between about 10 Å rms and about 50 Å rms. The linewidths of the masking portions of the second hard mask layer may be substantially the same as the linewidths of the corresponding masking portions of the resist layer as shown in FIG. 1D. This structure may be obtained by using an etchant with no selectivity for the second hard mask layer during the trim step.

In other embodiments, the linewidths of the masking portions of the second hard mask layer may be narrower than the linewidths of the corresponding masking portions of the resist layer. This structure may be obtained by using an etchant with a high selectivity for the second hard mask layer for the trim step as shown in FIG. 2B. The exposed surfaces 241 of the second hard mask layer are recessed under the photoresist layer.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims.

We claim:

1. A method of etching for an integrated circuit comprising:
   providing a first hard mask layer over a target layer, the first hard mask layer having a first thickness;
   providing a second hard mask layer over the first hard mask layer, the second hard mask layer having a second thickness, wherein the first thickness is substantially greater than the second thickness;
   providing a photoresist layer over the second hard mask layer, wherein the photoresist layer has a thickness between about 1,000 Å and about 2,000 Å;
   forming a pattern in the photoresist layer;
   transferring the pattern into the second hard mask layer; and
   trimming the second hard mask layer such that at least a portion of the photoresist layer protects a top surface of the second hard mask layer during all of trimming the second hard mask layer, wherein the second hard mask layer is trimmed at a rate between 1 Å and 10 Å per second on each side of the second hard mask layer such that the second hard mask layer has an average edge roughness between about 10 Å rms and about 50 Å rms.

2. The method of claim 1, wherein the first hard mask layer comprises an amorphous carbon layer or an organic underlayer.

3. The method of claim 1, wherein the second hard mask layer comprises an inorganic layer.

4. The method of claim 3, wherein the inorganic layer comprises a material selected from the group consisting of a dielectric anti-reflective coating (DARC), silicon oxynitride, silicon oxide, and silicon nitride.

5. The method of claim 1, wherein the second hard mask layer comprises a silicon-containing organic layer.

6. The method of claim 1, wherein the second hard mask layer has a thickness ranging from about 50 Å to about 1,000 Å.

7. The method of claim 1, wherein transferring the pattern into the second hard mask layer comprises using an anisotropic etch process.

8. The method of claim 7, wherein using the anisotropic etch process comprises using a fluorocarbon-based plasma.

9. The method of claim 1, wherein trimming the second hard mask layer comprises reducing a feature width of the second hard mask layer by at least about 10 Å.

10. The method of claim 1, wherein trimming the second hard mask layer comprises selectively etching the second hard mask layer relative to the photoresist layer and the first hard mask layer.

11. The method of claim 1, wherein trimming the second hard mask layer comprises etching the second hard mask layer at a rate of between about 1 and 1,000 times faster than the etch rate of the first hard mask layer.

12. The method of claim 1, wherein trimming the second hard mask layer comprises isotropically etching the second hard mask layer.

13. The method of claim 1, wherein trimming the second hard mask layer comprises etching the second hard mask layer with a plasma.

14. The method of claim 1, wherein trimming the second hard mask layer comprises using a wet etching process.

15. The method of claim 14, wherein using the wet etching process comprises using a buffered oxide etch process.

16. The method of claim 1, further comprising transferring a pattern resulting from trimming the second hard mask layer into the first hard mask layer.

17. The method of claim 16, wherein transferring the pattern resulting from trimming the second hard mask layer into the first hard mask layer comprises using a high density plasma etch process.

18. The method of claim 17, wherein transferring the pattern resulting from trimming the second hard mask layer into the first hard mask layer comprises etching the first hard mask layer at a rate of above about 5 times faster than the etch rate of the second hard mask layer.

19. The method of claim 1, further comprising providing a bottom antireflective coating (BARC) layer over the second hard mask layer.

20. The method of claim 19, wherein the bottom antireflective coating layer has a thickness ranging from about 200 Å to about 500 Å.

21. A method for manufacturing an integrated circuit device, comprising:
- providing a first hard mask over a substrate, the first hard mask having a first thickness;
- providing a second hard mask over the first hard mask, the second hard mask having a second thickness, wherein the first thickness is substantially greater than the second thickness;
- providing a resist having a pattern over the second hard mask, wherein the resist layer has a thickness between about 1,000 Å and about 2,000 Å;
- anisotropically etching the second hard mask using the pattern of the resist; and
- isotropically etching the second hard mask such that at least a portion of the resist protects a top surface of the second hard mask during all of isotropically etching the second hard mask, wherein the second hard mask is etched at an etch rate between 1 Å and 10 Å per second on each side of the second hard mask layer such that the second hard mask layer has an average edge roughness between about 10 Å rms and about 50 Å rms.

22. The method of claim 21, wherein the integrated circuit device comprises a memory or a microprocessor.

23. The method of claim 21, wherein the resist layer comprises a material selected from the group consisting of a photoresist and an imprint lithography resist.

* * * * *